(12) United States Patent
Ueshima et al.

(10) Patent No.: US 9,205,513 B2
(45) Date of Patent: Dec. 8, 2015

(54) BI—SN BASED HIGH-TEMPERATURE SOLDER ALLOY

(75) Inventors: Minoru Ueshima, Tokyo (JP); Yoshimi Inagawa, Tokyo (JP); Minoru Toyoda, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 13/261,554

(22) PCT Filed: Jun. 17, 2011

(86) PCT No.: PCT/JP2011/063894
§ 371 (c)(1),
(2), (4) Date: Dec. 28, 2012

(87) PCT Pub. No.: WO2012/002173
PCT Pub. Date: Jan. 5, 2012

(65) Prior Publication Data
US 2013/0121874 A1  May 16, 2013

(30) Foreign Application Priority Data

Jun. 30, 2010  (JP) .................. 2010-150318

(51) Int. Cl.
B23K 35/26 (2006.01)
B23K 1/00 (2006.01)
C22C 12/00 (2006.01)
H05K 3/34 (2006.01)

(52) U.S. Cl.
CPC ............. *B23K 35/264* (2013.01); *B23K 1/0016* (2013.01); *B23K 35/26* (2013.01); *C22C 12/00* (2013.01); *H05K 3/3463* (2013.01); *B23K 2201/42* (2013.01); *H05K 3/3494* (2013.01)

(58) Field of Classification Search
CPC ..................... H01L 2924/01083; C22C 12/00
USPC .................................. 420/577, 561
See application file for complete search history.

(56) References Cited

U.S. PATENT DOCUMENTS

| | | | |
|---|---|---|---|
| 2002/0012608 A1* | 1/2002 | Takaoka et al. ............... 420/561 |
| 2004/0170524 A1* | 9/2004 | Lambracht et al. ........... 420/577 |
| 2009/0301607 A1* | 12/2009 | Nakano et al. .................. 148/24 |
| 2010/0035072 A1* | 2/2010 | Watanabe ............. B22F 1/0059 428/457 |
| 2010/0301481 A1* | 12/2010 | Furusawa ............. B23K 1/0016 257/751 |

FOREIGN PATENT DOCUMENTS

| | | |
|---|---|---|
| JP | 2001353590 | 12/2001 |
| JP | 2004114093 | 4/2004 |
| JP | 2004533327 | 11/2004 |
| JP | 2005072173 | 3/2005 |
| JP | 2005072173 A * | 3/2005 |
| JP | 2005288529 | 10/2005 |

(Continued)

OTHER PUBLICATIONS

Machine translation of JP2005-072173A, Mar. 2005.*

*Primary Examiner* — Jie Yang
*Assistant Examiner* — Xiaowei Su
(74) *Attorney, Agent, or Firm* — Michael Tobias

(57) ABSTRACT

A high-temperature solder alloy is a Bi—Sn based solder alloy containing at least 90 mass % of Bi, further containing 1-5 mass % of Sn, at least one element selected from Sb and/or Ag each in an amount of 0.5-5 mass %, and preferably further containing 0.0004-0.01 mass % of P.

10 Claims, 1 Drawing Sheet

(56) References Cited

FOREIGN PATENT DOCUMENTS

| JP | WO 2007018288 A1 * | 2/2007 | ............ B22F 1/0059 |
| --- | --- | --- | --- |
| JP | 2007181880 | 7/2007 | |
| JP | WO 2009157130 A1 * | 12/2009 | ............ B23K 1/0016 |
| WO | WO 02097145 A1 * | 12/2002 | |
| WO | 2007018288 | 2/2007 | |

* cited by examiner

BI—SN BASED HIGH-TEMPERATURE SOLDER ALLOY

TECHNICAL FIELD

This invention relates to a Bi—Sn based high-temperature solder alloy.

BACKGROUND ART

Electronic equipment is equipment formed by disposing electronic parts on an external circuit such as a printed circuit board so as to perform their functions. From long in the past, electronic parts have been connected to external circuits such as printed circuit boards using solder because connection can be carried out at a low temperature, solder is inexpensive, and it produces high joint reliability. Electronic parts used in electronic equipment are provided with terminals such as part leads for connecting the parts to printed circuit boards.

Solder is also used inside electronic parts in locations where part elements, which perform their functions of electronic parts, are connected to part leads and the like. In this specification, soldering inside electronic parts in this manner will be referred to as "internal soldering" of electronic parts, and solder which is used for this purpose will be referred to as "internal joint" solder for electronic parts. Solder joints which are formed in this manner will be referred to as "internal solder joints".

Solder alloys used for soldering of electronic parts are alloys which have a composition close to 60% Sn and a low melting temperature among alloys of Sn and Pb. In particular, a solder alloy having a composition of Sn63-Pb37 has a solidus temperature and a liquidus temperature which are both 183° C. By using this solder, there is little occurrence of cracks at the time of cooling of the solder, and because it has the lowest melting point among all solder alloys of Sn and Pb, there is little damage to electronic parts due to heat. It is so widely used that the term "solder" generally refers to a Sn63-Pb37 solder alloy. However, during assembly of electronic equipment, heating also takes place in order to solder electronic parts to external circuits. If this Sn63-Pb37 solder alloy is used for internal soldering of electronic parts, due to the heating at this time, solder melts inside the electronic parts and causes shorts, part elements and part leads which were joined by solder separate from each other, and the electronic parts can no longer function. Therefore, solders for internal soldering of electronic parts are ones having a higher melting temperature than a Sn63-Pb37 solder alloy. These solder alloys are referred to as high-temperature solders because they have a higher melting temperature than solder alloys such as Sn63-Pb37 used for soldering printed circuit boards.

The compositions of conventional high-temperature solders used for internal soldering of electronic parts mainly have Pb as a main component and include Pb-10Sn (solidus temperature of 268° C. and liquidus temperature of 302° C.), Pb-5Sn (solidus temperature of 307° C. and liquidus temperature of 313° C.), Pb-2Ag-8Sn (solidus temperature of 275° C. and liquidus temperature of 346° C.), Pb-5Ag (solidus temperature of 304° C. and liquidus temperature of 365° C.), and the like. Because the solidus temperature of these high-temperature solders is at least 260° C., soldered portions inside electronic parts which are soldered with the above-described high-temperature solders do not melt at the time of soldering of printed circuit boards even when the soldering temperature is 230° C., which is somewhat higher than that usually occurring when using a Sn63-Pb37 eutectic solder for soldering printed circuit boards In recent years, because the toxicity of Pb is becoming a problem, so-called lead-free solder is being increasingly widely used. At present, widely used lead-free solders include Sn-3Ag-0.5Cu (solidus temperature of 217° C. and liquidus temperature of 220° C.), Sn-8Zn-3Bi (solidus temperature of 190° C. and liquidus temperature of 197° C.), Sn-2.5Ag-0.5Cu-1Bi (solidus temperature of 214° C. and liquidus temperature of 221° C.), and the like. These lead-free solders have a melting temperature which is close to 40° C. higher than that of a conventional Sn63-Pb37 solder alloy.

However, even if one considers using a high-temperature lead-free solder for initial soldering, due to regulations on Pb, there has been no high-temperature solder having Sn as a main component and having a solidus temperature of at least 260° C. For example, in the case of a Sn—Ag based solder having a solidus temperature (eutectic point) of 221° C., the liquidus temperature increases if Ag is increased, but the solidus temperature does not increase. If the Sb content of a Sn—Sb based solder having a solidus temperature of 227° C. is increased as much as possible, the liquidus temperature greatly increases. Even if other elements are added to these alloys, the solidus temperature increases, and this tendency cannot be changed. Therefore, it has been thought impossible to use a lead-free solder as a high-temperature solder for internal soldering of electronic parts.

In Patent Document 1, as an invention of a solder alloy which is a replacement for a Pb—Sn high-temperature solder, the present applicant disclosed a solder paste which is characterized by comprising a high-temperature solder powder and a flux containing a thermosetting adhesive. The solder paste has Bi as a main component, it has a solidus temperature of at least 260° C. and a liquidus temperature of at most 360° C., and it is selected from Bi powder or Bi—Ag based powder, Bi—Cu based powder, Bi—Sb based powder, and Bi—Zn based powder.

Patent Document 2 discloses a solder composition comprising Bi, Ag as a second element, and a third element selected from Sn, Cu, In, Sb, and Zn.

PRIOR ART DOCUMENTS

Patent Documents

Patent Document 1: JP 2005-72173 A
Patent Document 2: JP 2001-353590 A

SUMMARY OF THE INVENTION

Problem which the Invention is to Solve

However, the solder alloy disclosed by the present applicant in Patent Document 1 in which Ag, Cu, and the like are added to Bi could not be actually used because such a Bi alloy has a low strength.

The Bi—Ag based solder alloy disclosed in Patent Document 2 has a solder composition in which one element selected from Sn, Cu, In, Sb, and Zn is added to Bi and Ag. It has the properties that it does not crack even when bonded to a brittle material such as glass, and it utilizes the property of Bi that it does not contract during solidification. However, the invention of Patent Document 2 has a low strength, and the solder alloy is premised on being used with a packaging resin. When the solder alloy could not be covered with a packaging resin, therefore, the solder alloy could not be used.

In this manner, a conventional Bi—Ag based high-temperature solder alloy had a low strength of the solder alloy itself, and use of a packaging resin was unavoidable. Therefore, the locations where it could be used were limited.

The object of the present invention is to provide a Bi—Sn based solder alloy and a solder joint, the solder alloy being usable in the same manner as a conventional Pb—Sn based high-temperature solder even without employing a packaging resin.

Means for Solving the Problem

The present inventors found that by limiting the content of Sn in a Bi—Sn based solder alloy to 1-5 mass % and adding 0.5-5 mass % of Sb, the strength of the solder alloy is increased, and a solder strength which is the same as that of a conventional Pb—Sn based high-temperature solder is obtained. As a result, they completed the present invention.

The present inventors also found that Ag exhibits the same effect as Sb in a Bi—Sn based solder alloy.

The present invention is a solder alloy characterized by adding at least one of Sb: 0.5-5 mass % and Ag: 0.5-5 mass % to a Bi—Sn solder alloy containing at least 90 mass % of Bi and 1-5 mass % of Sn.

According to a preferred mode of the present invention, the above-described solder alloy may further contain 0.0004-0.01 mass % of P.

According to another mode, the present invention is a high-temperature solder joint and particularly a solder joint for internal soldering having the composition of the above-described solder alloy.

In this description, there are cases in which the content of each component is indicated just by a number for convenience, cases in which it is indicated as "%", and cases in which it is indicated as "mass %". However, each case refers to mass %.

Effects of the Invention

The present invention makes it possible to obtain a high-temperature Bi—Sn based solder alloy having a high solder strength and good wettability and a solder joint having excellent heat resistance. A packaging resin which was necessary with a conventional Bi—Ag based solder becomes unnecessary. In the past, the locations where a solder could be applied were limited. However, a Bi—Sn based solder alloy according to the present invention can be used regardless of the location of use.

EMBODIMENTS OF THE INVENTION

Figure 1:
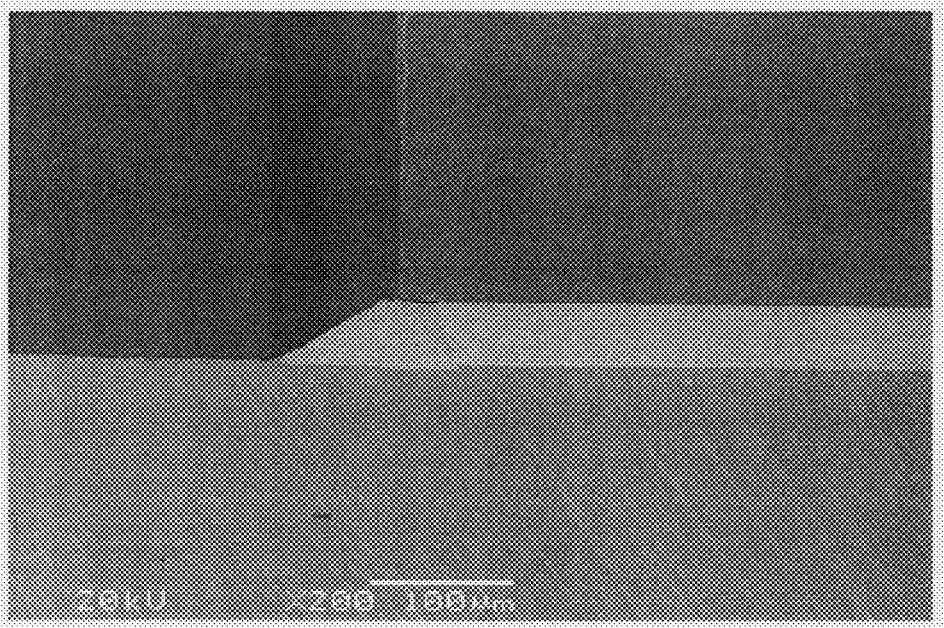
FIG. 1 is a cross-sectional view of a solder joint showing the results of a heat resistance test in an example.

Conventionally, a Bi—Sn based alloy easily forms a Bi—Sn eutectic structure. Therefore, as seen in Patent Document 1, only a small number of Bi—Sn alloys in which a very small amount of Sn was added, such as at most 0.5% were known.

The present inventors found that even in the case of a Bi—Sn based alloy having a Sn content of 1-5 mass %, the addition of Sb suppresses the formation of a Bi—Sn eutectic structure having hard brittle properties, and it is possible to obtain a Bi—Sn based solder alloy with the alloy having a high strength.

The reason why the formation of a Bi—Sn eutectic structure is suppressed by the addition of Sb is not well understood, but it is conjectured that it is related to the fact that Sb, which is added to a Bi—Sn based solder alloy according to the present invention, is a metal which entirely forms a solid solution with Bi. Although the same effect is obtained by the addition of Ag, however, it is conjectured that the mechanism of suppressing the formation of a Bi—Sn eutectic structure is different for Sb and Ag.

The addition of Ag can further increase the wettability of a Bi—Sn solder alloy. The effect of adding Ag to a Bi—Sn solder alloy according to the present invention is observed even when Ag is added alone to a Bi—Sn solder. However, when Ag is added together with Sb, the wettability of solder which has decreased by the addition of Sb can be improved and the best effect is exhibited.

A solder alloy according to the present invention is used as a high-temperature solder. Therefore, if the eutectic point of 139° C. for Sn—Bi (the Sn content for the eutectic point is approximately 65 mass %) clearly occurs during use, the solder melts at the time of second reflow and cannot be used as a high-temperature solder. Furthermore, when Bi is used by itself, its wettability with respect to metals used in circuit boards such as Cu is poor and bonding strength is not obtained.

Accordingly, it is necessary to add a small amount of Sn to Bi.

In the present invention, the Bi content is made at least 90 mass % because if the Bi content is smaller than 90 mass %, or in other words, if a large amount of Sn is added, Sn has the effect of lowering the melting point, and it becomes necessary to increase the added amount of Ag or Sb in order to guarantee the properties of a high-temperature solder such as a solidus temperature of at least 250° C. In such a case, the amount of Ag3Sn or SnSb intermetallic compounds in a Bi alloy increases and the strength of the solder increases, but ductility decreases, and it becomes easy for cleavage fracture to take place. If the added amount of Sn is decreased and the added amount of Ag or Sb is increased, even if the solder begins to melt, Sn remains as Ag3Sn or SnSb intermetallic compounds, and at the start of wetting, almost no Sn is present in molten Bi, and wettability becomes extremely poor.

Considering only wettability, ideally 1-2% of Sn is present in molten Bi at the initial stage of wetting, and the Sn is consumed by a reaction with electrodes. However, even when the amount of Sn in Bi decreases, as heating is continued, Ag3Sn and SnSb intermetallic compounds in the solder decompose, Sn is supplied to the molten Bi, wettability is maintained, and good spreading of solder is maintained.

In this manner, it is possible to improve wettability by simply increasing the Sn content. However, in a solder alloy according to the present invention which blends at least 90 mass % of Bi and 1-5 mass % of Sn, Ag3Sn or SnSb intermetallic compounds which have once decomposed again bond with Sn to again form intermetallic compounds at the time of solidification of the solder and thereby prevent a decrease in the melting point. As a result, the effect is obtained of maintaining strength at high-temperatures, which effect cannot be realized by a solder to which Sn is solely added.

When the content of Sn in the present invention is less than 1 mass %, in the same manner as when Bi is used by itself, wettability is poor, while if the Sn content exceeds 5 mass %, even if Sb or Ag is added, thick Sn—Cu intermetallic compounds are formed and the soldering strength decreases. Accordingly, the Sn content is 1-5 mass %. A preferred lower limit on Sn is 1.5 mass %. Similarly, a preferred upper limit is 3 mass % and more preferably 2 mass %.

In the present invention, at least one element selected from the group consisting of Sb and Ag is blended in the above-described Bi—Sn based solder alloy.

If the amount of Sb added to a Bi—Sn based solder alloy according to the present invention is less than 0.5 mass %, an improvement in the strength of the solder alloy is not obtained, while if the amount is larger than 5 mass %, the wettability of the solder alloy decreases and the strength of a solder joint is not improved. Accordingly, Sb is added in an amount of 0.5-5 mass %. A preferred lower limit is 2 mass %. A preferred upper limit is 3 mass %.

If the amount of Ag added to a Bi—Sn based solder alloy according to the present invention is smaller than 0.5 mass %, there is almost no improvement in wettability, while if it is larger than 5 mass %, a Sn—Ag intermetallic compound layer becomes thick and the strength of a solder joint decreases. Accordingly, the amount of Ag added in the present invention is 0.5-5 mass %. Preferably it is 2-4 mass %.

In order to improve its wettability, a high-temperature solder alloy according to the present invention may contain 0.0004-0.01 mass % of P. If the P content is less than 0.0004 mass %, the effect of improving wettability is inadequate, while a P content exceeding 0.01 mass % produces a decrease in strength. The P content is preferably 0.001-0.005 mass %.

A high-temperature solder alloy according to the present invention is used for internal soldering of electronic parts, but it can also be used for soldering of locations which generate heat when they conduct electricity such as power transistors or transformers.

A solder joint and particularly an internal solder joint which is obtained using a high-temperature solder alloy according to the present invention can exhibit the excellent effect that peeling of the joint is not observed even when secondary reflow soldering is carried out.

Examples

The solder alloys having the compositions shown in Table 1 were prepared, and the melting temperature, the bulk strength, the solder spreading rate, and the solderability of the solder alloys as well as the heat resistance of solder joints in the form of internal solder joints were measured in the following manner.

The melting temperatures of the solder alloys were measured in accordance with JIS Z 3198-1. The measuring apparatus was a thermal analyzer (DSC6000) manufactured by SII NanoTechnology Inc. The melting temperatures were measured at a rate of temperature increase of 30° C. per minute.

The temperature at the start of solidification (liquidus temperature) was measured using the same apparatus.

The bulk strength of the solder alloys was measured in accordance with JIS Z 3198-2 using a AG-20KN manufactured by Shimadzu Corporation.

The solder spreading rate was measured in accordance with JIS Z 3198-3. Two types of substrates were used, namely, a ceramic substrate having Ag electrodes and a glass epoxy substrate having Cu electrodes. Measurement was carried out in a nitrogen atmosphere using a solder bath for heating having a temperature of 330° C.

The test conditions and the standards for evaluation of solderability (wettability) and heat resistance (peeling resistance) in a high-temperature heating test were as follows.

Solderability Test (i) Preparation of test piece: A solder wire was directly supplied to an electrode of a lead frame in a hydrogen reducing atmosphere and soldered without using flux.

(ii) silicon chip: 5.5×5.5 mm, Ni/Au plating (0.05 μm)

(ii) Cu lead frame: pad dimensions=6.0×6.0 mm, plating: electroplated Cu (2 μm), electroplated Ag (5 μm)

(iii) Soldering apparatus (for solder supply and silicon chip mounting): Model BESTEM-D03Hp die bonder manufactured by Canon Machinery Inc.

(iv) Soldering profile: solder supply at 350° C., silicon chip mounting at 350° C., hydrogen/nitrogen atmosphere with hydrogen:nitrogen ratio of 9:1

(v) Resin molding: embedding in an epoxy resin, and curing by sitting for 24 hours at room temperature to form a resin thickness of 3 mm For some of the solders, soldering to a Cu lead frame (electrode) was difficult when preparing a test piece, and a test of resistance to high temperatures could not be carried out for these solders. Solders which could be supplied to a Cu electrode were evaluated as good (○).

Figure 2:
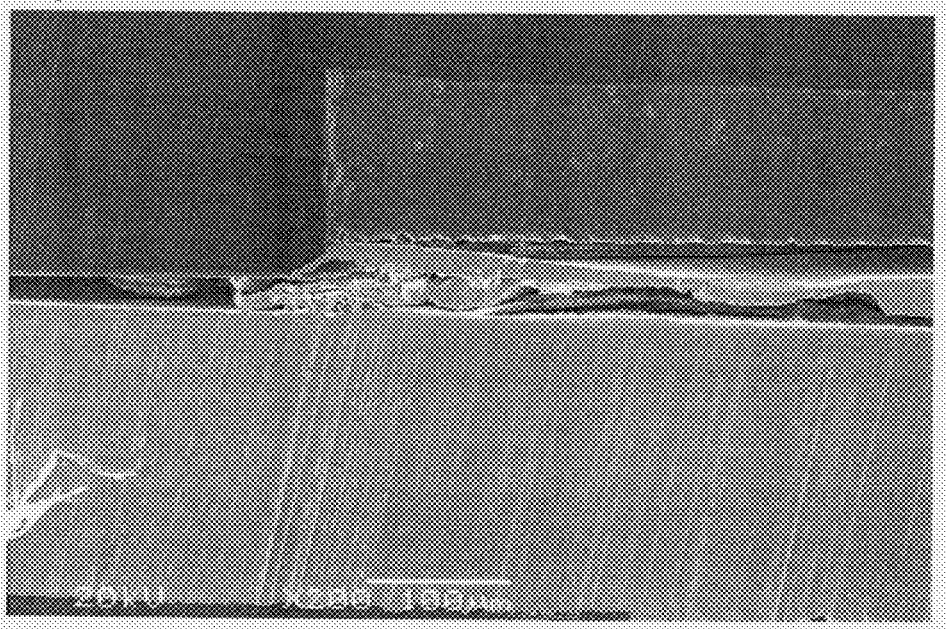
FIG. 2 is a cross-sectional view of a solder joint showing the results of a heat resistance test in a comparative example.

High-Temperature Heat Resistance Test:

A solder bath having a capacity of 1.5 kg and a solder bath temperature of 240° C. or 250° C. was prepared, and a die bonded silicon chip part which had been molded in an epoxy resin was immersed in the solder for 120 seconds to carry out a heat resistance test. After the test of resistance to high temperatures, a cross section of the test piece was observed with a SEM at 200×. A case like that shown in FIG. 1 in which there was no melting of solder, no peeling at the solder joint, and no peeling in the interface between the resin and the lead frame was evaluated as good (○). A case like that shown in FIG. 2 in which there was peeling of the solder joint or peeling in the interface between the resin and the lead frame was evaluated as poor (x).

The results are compiled in Table 1.

TABLE 1

| | | Solder composition (mass %) | | | | | Temperature (° C.) | | Strength (N) | Solder spreading rate (%) | | Solder wettability | | Peeling at 240° C. | | Peeling at 250° C. | |
|---|---|---|---|---|---|---|---|---|---|---|---|---|---|---|---|---|---|
| | | Bi | Sn | Sb | Ag | P | Solidus | Liquidus | | Cu electrode | Ag electrode | Cu electrode | Ag electrode | Cu electrode | Ag electrode | Cu electrode | Ag electrode |
| Example of Invention | 1 | rem | 1 | 0.5 | | | 250 | 265 | 28 | 60 | 78 | ○ | ○ | ○ | ○ | ○ | ○ |
| | 2 | rem | 2 | 2 | | | 255 | 265 | 35 | 61 | 78 | ○ | ○ | ○ | ○ | ○ | ○ |
| | 3 | rem | 2 | | 3 | | 255 | 275 | 28 | 62 | 85 | ○ | ○ | ○ | ○ | ○ | ○ |
| | 4 | rem | 1 | | 4 | | 262 | 280 | 31 | 60 | 80 | ○ | ○ | ○ | ○ | ○ | ○ |
| | 5 | rem | 5 | | 5 | | 250 | 300 | 42 | 69 | 90 | ○ | ○ | ○ | ○ | x | x |
| | 6 | rem | 3 | 5 | | | 265 | 280 | 45 | 63 | 80 | ○ | ○ | ○ | ○ | ○ | ○ |
| | 7 | rem | 5 | 5 | | | 260 | 270 | 35 | 68 | 85 | ○ | ○ | ○ | ○ | ○ | ○ |

TABLE 1-continued

| | | Solder composition (mass %) | | | | | Temperature (°C) | | Strength (N) | Solder spreading rate (%) | | Solder wettability | | Peeling at 240° C. | | Peeling at 250° C. | |
|---|---|---|---|---|---|---|---|---|---|---|---|---|---|---|---|---|---|
| | | Bi | Sn | Sb | Ag | P | Solidus | Liquidus | | Cu electrode | Ag electrode | Cu electrode | Ag electrode | Cu electrode | Ag electrode | Cu electrode | Ag electrode |
| | 8 | rem | 4 | 3 | | | 247 | 265 | 42 | 65 | 85 | ○ | ○ | ○ | ○ | ○ | ○ |
| | 9 | rem | 4 | 2 | | | 245 | 260 | 38 | 70 | 88 | ○ | ○ | ○ | ○ | x | ○ |
| | 10 | rem | 2 | 1 | | | 248 | 263 | 30 | 63 | 82 | ○ | ○ | ○ | ○ | ○ | ○ |
| | 11 | rem | 2 | 4 | | | 270 | 280 | 44 | 64 | 82 | ○ | ○ | ○ | ○ | ○ | ○ |
| | 12 | rem | 1.5 | 3 | | | 265 | 275 | 38 | 60 | 72 | ○ | ○ | ○ | ○ | ○ | ○ |
| | 13 | rem | 2 | 1 | 3 | | 255 | 260 | 35 | 62 | 81 | ○ | ○ | ○ | ○ | ○ | ○ |
| | 14 | rem | 2 | 2 | 3 | | 258 | 263 | 42 | 60 | 80 | ○ | ○ | ○ | ○ | ○ | ○ |
| | 15 | rem | 2 | 2 | 3 | 0.002 | 258 | 263 | 42 | 70 | 85 | ○ | ○ | ○ | ○ | ○ | ○ |
| | 16 | rem | 2 | 2 | | 0.004 | 255 | 265 | 35 | 70 | 85 | ○ | ○ | ○ | ○ | ○ | ○ |
| Comparative Example | 1 | rem | 0 | 2 | | | 274 | 278 | 32 | 0 | 0 | x | x | — | — | — | — |
| | 2 | rem | 0 | | 3 | | 262 | 270 | 25 | 0 | 0 | x | x | — | — | — | — |
| | 3 | rem | 2 | | | | 245 | 265 | 19 | 60 | 80 | ○ | ○ | ○ | ○ | ○ | ○ |
| | 4 | rem | 2 | 8 | | | 290 | 340 | 55 | 0 | 50 | x | ○ | — | ○ | — | ○ |
| | 5 | rem | 2 | | 10 | | 262 | 330 | 45 | 0 | 30 | x | ○ | — | ○ | — | ○ |
| | 6 | rem | 6 | 2 | | | 139 | 230 | 35 | 71 | 90 | ○ | ○ | x | x | x | x |
| | 7 | rem | 2 | 0.3 | | | 245 | 265 | 20 | 60 | 80 | ○ | ○ | ○ | ○ | ○ | ○ |
| | 8 | rem | 7 | 2 | | | 139 | 225 | 40 | 70 | 90 | ○ | ○ | x | x | x | x |
| | 9 | rem | 3 | 5 | 5 | | 262 | 360 | 48 | 0 | 45 | x | ○ | — | ○ | — | ○ |
| | 10 | rem | 0.3 | 2 | 3 | | 265 | 280 | 38 | 0 | 0 | x | x | — | — | — | — |
| | 11 | rem | 10 | 5 | 3 | | 139 | 280 | 40 | 75 | 90 | ○ | ○ | x | x | x | x |
| | 12 | Pb—10Sn | 10 | | | | 260 | 300 | 40 | 80 | 95 | ○ | ○ | ○ | ○ | x | ○ |
| | 13 | rem | 0 | 0 | 3 | | 262 | 270 | 25 | 0 | 0 | — | — | — | — | — | — |
| | 14 | rem | 0 | 2 | 0 | | 274 | 278 | 32 | 0 | 0 | — | — | — | — | — | — |
| | 15 | rem | 0 | 2 | 3 | | 265 | 280 | 38 | 0 | 0 | — | — | — | — | — | — |
| | 16 | rem | 2 | 0 | 0 | | 245 | 265 | 19 | 62 | 80 | — | — | — | — | — | — |

Bi—Sn based solder alloys according to the present invention had a high solder strength and good wettability with respect to Cu electrodes and Ag electrodes, whereas the solder alloys of the comparative examples had a low solder strength and poor wettability with respect to Cu electrodes or Ag electrodes.

In addition, the solidus temperature of all of the Bi—Sn based solder alloys according to the present invention was at least 250° C., showing that they had the properties of a high-temperature solder.

The invention claimed is:

1. A high-temperature solder alloy consisting of 1-5 mass % of Sn, 1-5 mass % of Sb, optionally 0.0004-0.01 mass % of P, and a remainder of Bi.

2. A high-temperature solder alloy as claimed in claim 1 containing 0.0004-0.01 mass % of P.

3. A high-temperature solder alloy as claimed in claim 1 containing 1.5-3 mass % of Sn.

4. A high-temperature solder alloy as claimed in claim 1 containing 1.5-2 mass % of Sn.

5. A high-temperature solder alloy as claimed in claim 1 containing 2-3 mass % of Sb.

6. A high-temperature solder alloy as claimed in claim 1 containing 0.001-0.005 mass % of P.

7. A high-temperature solder alloy as claimed in claim 1 which has a solidus temperature of at least 245° C.

8. A high-temperature solder alloy as claimed in claim 1 which has a solidus temperature of at least 250° C.

9. An electronic part comprising a metal lead frame having a plurality of Cu electrodes, a die-bonded silicon chip, and a solder joint which is made of a solder alloy as claimed in claim 1 and connects the silicon chip to the lead frame.

10. An electronic part as claimed in claim 9 wherein the lead frame is a Cu lead frame having Cu plating.

* * * * *